(12) United States Patent
Yao et al.

(10) Patent No.: US 12,341,144 B2
(45) Date of Patent: Jun. 24, 2025

(54) TOUCH LIGHT-EMITTING DECORATION NAMEPLATE

(71) Applicant: Darwin Precisions Corporation, Hsinchu County (TW)

(72) Inventors: Hsuan Yao, Hsinchu County (TW); Yu Jen Lai, Hsinchu County (TW)

(73) Assignee: DARWIN PRECISIONS CORPORATION, Hsinchu County (TW)

( * ) Notice: Subject to any disclaimer, the term of this patent is extended or adjusted under 35 U.S.C. 154(b) by 4 days.

(21) Appl. No.: 18/113,320

(22) Filed: Feb. 23, 2023

(65) Prior Publication Data

US 2024/0030206 A1  Jan. 25, 2024

(30) Foreign Application Priority Data

May 5, 2022 (TW) .................................. 111117018

(51) Int. Cl.
*G06F 3/045* (2006.01)
*G06F 3/044* (2006.01)
(Continued)

(52) U.S. Cl.
CPC ............ *H01L 25/167* (2013.01); *G06F 3/044* (2013.01); *G09F 13/04* (2013.01); *H01L 21/4846* (2013.01); *G06F 2203/04103* (2013.01)

(58) Field of Classification Search
CPC ......... H01L 25/167; G06F 3/044; G09F 13/04
(Continued)

(56) References Cited

U.S. PATENT DOCUMENTS

2015/0070794 A1* 3/2015 Wu ....................... G06F 1/1692
                                                                 359/838
2018/0111874 A1* 4/2018 O'Ryan .................. C03C 17/32
(Continued)

FOREIGN PATENT DOCUMENTS

CN    103803811 A    5/2014
CN    212749803 U    3/2021
(Continued)

OTHER PUBLICATIONS

China National Intellectual Property Administration has issued the Office Action for the corresponding China application on Feb. 18, 2025.

*Primary Examiner* — Jonathan M Blancha
(74) *Attorney, Agent, or Firm* — WPAT, PC

(57) ABSTRACT

Embodiments of the instant disclosure are directed to a touch light-emitting decoration nameplate and a fabrication method thereof. The touch light-emitting decoration nameplate comprises a transparent substrate, a first decoration ink layer, a circuit layer, a light-emitting element and an electronic element. The transparent substrate includes a first surface and a second surface, and the second surface is disposed opposite to the first surface. The first decoration ink layer is disposed on either the first surface or the second surface of the transparent substrate. The circuit layer is disposed on either the first decoration ink layer or the first surface of the transparent substrate. The circuit layer includes at least a light-emitting line and a touch-sensing line. The light-emitting element is disposed on the light-emitting line of the circuit layer, and is electrically connected to the light-emitting line. The electronic element is disposed on the circuit layer, and is electrically connected to the light-emitting line and the touch-sensing line.

20 Claims, 3 Drawing Sheets

(51) Int. Cl.
  *G09F 13/04*    (2006.01)
  *H01L 21/48*    (2006.01)
  *H01L 25/16*    (2023.01)

(58) Field of Classification Search
  USPC .......................................................... 345/174
  See application file for complete search history.

(56) References Cited

U.S. PATENT DOCUMENTS

2019/0179455  A1*  6/2019  Sääski ....................... B32B 9/06
2022/0252778  A1*  8/2022  Taniguchi ............... B29C 33/42

FOREIGN PATENT DOCUMENTS

| TW | M472707 U | 2/2014 |
| TW | I662334 B | 6/2019 |
| TW | 201941029 | 10/2019 |
| TW | 202036255 A | 10/2020 |
| TW | M604000 U | 11/2020 |

\* cited by examiner

TOUCH LIGHT-EMITTING DECORATION NAMEPLATE

CROSS-REFERENCE TO RELATED APPLICATION

This application claims the priority benefit of Taiwan application serial no. 111117018 filed on May 5, 2022. The entirety of the above-mentioned patent applications is hereby incorporated by reference herein and made a part of this specification.

BACKGROUND

Technical Field

The instant disclosure generally relates to a touch light-emitting decoration nameplate and a fabrication method thereof. Particularly, the instant disclosure relates to a touch light-emitting decoration nameplate having high touch sensitivity and a fabrication method thereof.

Related Art

At present, nameplates have been widely used in various indicators and keypads. Because nameplates have the characteristics and advantages of being thin and light and have simple structures, along with the growth and development of electronic equipment, more and more nameplates are applied to peripheral indicators and keypads in all kinds of machines and electronic equipment. Moreover, with the progress of touch-sensing technologies, more and more nameplates have touch-sensing functions. As a result, there is more electronic equipment that requires touch-sensing nameplates for keypads and indicators.

In the past, nameplates with touch-sensing functions mainly use printed circuit boards with sensing circuits to perform touch-sensing functions. However, nameplates fabricated with the printed circuit board have a relatively thicker thickness and a complex structure, such that a size error and an alignment error during the fabrication process may easily occur. Accordingly, problems of low touch sensitivity and touch sensing shift may happen. These are issued to be resolved for people skilled in the related art.

SUMMARY

An object of the instant disclosure is directed to a touch light-emitting decoration nameplate with a simplified design. A decoration ink layer is disposed on a transparent substrate. In addition, a circuit layer that includes a light-emitting line and a touch-sensing line is disposed on the decoration ink layer or the transparent substrate, such that the overall thickness can be relatively reduced. Since the touch-sensing line is separated from the user by only the decoration ink layer and the transparent substrate, the touch-sensing distance is relatively reduced, and thus the touch sensitivity can be greatly improved.

An embodiment of the instant disclosure is directed to a touch light-emitting decoration nameplate. The touch light-emitting decoration nameplate comprises a transparent substrate, a first decoration ink layer, a circuit layer, a light-emitting element, and an electronic element. The transparent substrate includes a first surface and a second surface, and the second surface is disposed opposite to the first surface. The first decoration ink layer is disposed on either the first surface or the second surface of the transparent substrate. The circuit layer is disposed on either the first decoration ink layer or the first surface of the transparent substrate, and the circuit layer includes at least a light-emitting line and a touch-sensing line. The light-emitting element is disposed on the light-emitting line of the circuit layer and electrically connected to the light-emitting line. The electronic element is disposed on the circuit layer and electrically connected to the light-emitting line and the touch-sensing line.

Another embodiment of the instant disclosure is directed to a fabrication method of a touch light-emitting decoration nameplate. The fabrication method comprises the following steps. A transparent substrate which includes a first surface and a second surface disposed opposite to each other is provided. A first decoration ink layer is formed on either the first surface or the second surface of the transparent substrate. A circuit layer is formed on either the first decoration ink layer or the first surface of the transparent substrate, and the circuit layer includes at least a light-emitting line and a touch-sensing line. A light-emitting element is disposed on the light-emitting line of the circuit layer, and the light-emitting element is electrically connected to the light-emitting line. An electronic element is disposed on the circuit layer, and the electronic element is electrically connected to the light-emitting line and the touch-sensing line.

The touch light-emitting decoration nameplate of the instant disclosure has a relatively thinner thickness when compared to a nameplate fabricated with a conventional technology. The circuit layer which includes the light-emitting line and the touch-sensing line is disposed on only the decoration ink layer or the transparent substrate. Therefore, the overall thickness of the nameplate can be greatly reduced by the relatively simplified structure design of the instant disclosure. Since the touch-sensing line is separated from the user by only the decoration ink layer and the transparent substrate, the touch-sensing distance is relatively reduced, and thus the touch sensitivity can be greatly improved. Furthermore, the circuit layer can be formed directly aligned to the decoration ink layer, so that a size tolerance and an alignment tolerance between the circuit layer and the decoration ink layer can be minimized. Therefore, the problem of touch sensing shift can be reduced.

DETAILED DESCRIPTION

Figure 1:
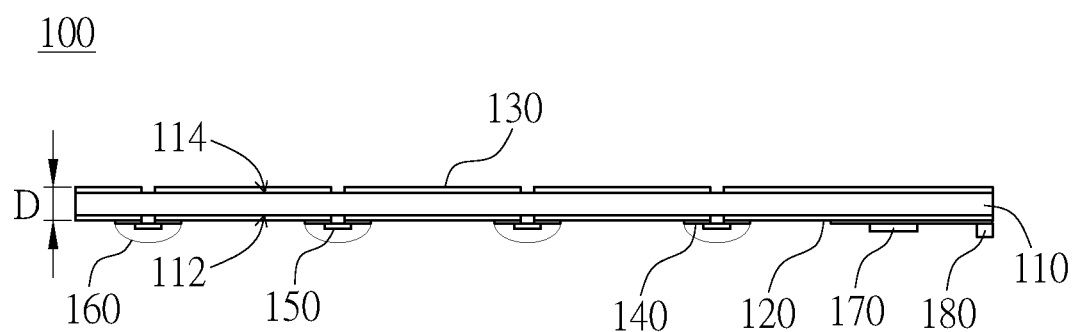
FIG. 1 is a schematic diagram of a cross-sectional view of a touch light-emitting decoration nameplate in an embodiment of the instant disclosure.
Figure 2:
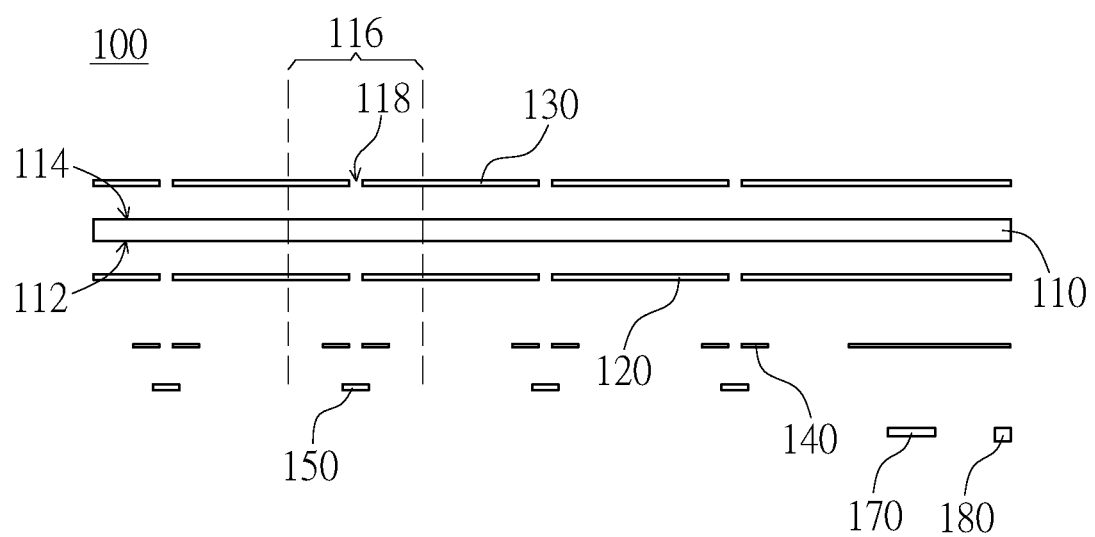
FIG. 2 is a schematic diagram of an exploded view of a touch light-emitting decoration nameplate in an embodiment of the instant disclosure.
Figure 3:
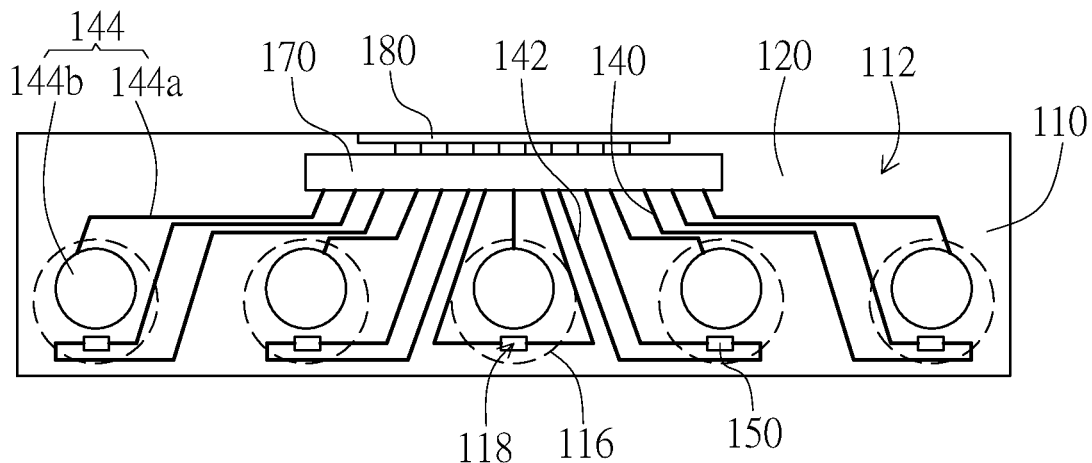
FIG. 3 is a schematic diagram of a top view from the back side of a touch light-emitting decoration nameplate in an embodiment of the instant disclosure.

FIG. 1 is a schematic diagram of a cross-sectional view of a touch light-emitting decoration nameplate in an embodiment of the instant disclosure. FIG. 2 is a schematic diagram of an exploded view of a touch light-emitting decoration nameplate in an embodiment of the instant disclosure. FIG. 3 is a schematic diagram of a top view from the back side of a touch light-emitting decoration nameplate in an embodiment of the instant disclosure. Referring to FIGS. 1-3, a touch light-emitting decoration nameplate 100 of the instant disclosure comprises at least a transparent substrate 110, a first decoration ink layer 120, a circuit layer 140, at least a light-emitting element 150 and an electronic element 170. The transparent substrate 110 has a first surface 112 and a second surface 114 disposed opposite to each other. In other words, the first surface 112 and the second surface 114 are disposed on opposite sides of the transparent substrate 110. The transparent substrate 110 can be a light-transmitting hard substrate or a light-transmitting flexible substrate. For example, the transparent substrate 110 may include a transparent plastic substrate, a transparent glass substrate, a transparent ceramic substrate, or a combination thereof, but not limited thereto. The material of the transparent plastic substrate may be polyamide (PA), polyimide (PI), polycarbonate (PC), polyurethane (PU), polyethyleneimine (PEI), polyethylene naphthalate (PEN), polyethylene terephthalate (PET), polyethersulfone (PES), fiber reinforced plastics (FRP), poly(methyl methacrylate) (PMMA), polyetheretherketon (PEEK), polydimethyl-siloxane (PDMS), etc., or other acrylate-series polymer, ether-series polymer, polyolefin-series polymer, epoxy resin-series polymer, other suitable material, or a combination thereof, but not limited thereto. The material of the transparent glass substrate may be soda lime glass, borosilicate glass, lead glass, quartz glass, tempered glass, etc., or a combination thereof, but not limited thereto. The transparent ceramic substrate preferably uses a thin ceramic substrate. The material of the transparent ceramic substrate may be transparent aluminum oxide, transparent aluminum nitride, transparent silicon oxide, transparent silicon nitride, etc., or a combination thereof, but not limited thereto.

In one embodiment of the instant disclosure, a nameplate with dual decoration ink layers is exemplarily demonstrated in the following description, but the instant disclosure is not limited thereto. A nameplate with a single decoration ink layer is also described in another embodiment of the instant disclosure. As shown in FIG. 1, the first decoration ink layer 120 is disposed on the first surface 112 of the transparent substrate 110. In addition, a second decoration ink layer 130 is disposed on the second surface 114 of the transparent substrate 110. The first decoration ink layer 120 and the second decoration ink layer 130 can be exchanged. In other words, the first decoration ink layer 120 can be disposed on the second surface 114, and the second decoration ink layer 130 can be disposed on the first surface 112. Each of the first decoration ink layer 120 and the second decoration ink layer 130 includes a colored dielectric layer which is made of ink having high light-shielding capability. The material of the ink may have the property of light extinction or light varnish. The ink may be a single-color ink of the color such as black, white, gray, green, yellow, blue, red, etc. The ink can also be composed of a multi-colored ink, depending on the requirement of the user. The first decoration ink layer 120 and the second decoration ink layer 130 can be designed to have one or more light-out pattern regions 116 corresponding to one or more subsequently disposed light-emitting elements 150. Each of the light-out pattern regions 116 can be designed to have a corresponding patterned opening 118 without ink therein, or with ink having a light color or a thin thickness to obtain the result of high light transmission, semi-light transmission or low light transmission. The patterned opening 118 of the light-out pattern region 116 can be designed to have, e.g., a functional pattern or a decorative pattern. For example, a pattern shape of the patterned opening 118 in the light-out pattern region 116 may be a number symbol, a letter symbol, an arrow symbol, a power symbol, a sound volume symbol, etc., and may be decided according to the usage requirement. The first decoration ink layer 120 and the second decoration ink layer 130 can be formed on the transparent substrate 110 by an ink-jet printing process or a screen printing process. The first decoration ink layer 120 and the second decoration ink layer 130 can be made of a single ink layer or multiple ink layers of the same color or different colors. The thickness of the first decoration ink layer 120 and the second decoration ink layer 130 can be adjusted according to the ink color requirement, the ink light-shielding effect, the light transmission effect in the light-out region and the touch sensitivity, depending on the usage requirement.

The circuit layer 140 which includes at least one or more light-emitting lines 142 and one or more touch-sensing lines 144 is disposed on the first decoration ink layer 120. The circuit layer 140 may be a printed circuit layer made of a patterned circuit formed on the first decoration ink layer 120 by an ink-jet printing process or a screen printing process. The printed circuit layer can be directly formed on the first decoration ink layer 120 after a low temperature curing process, and the overall thickness of the final product can be relatively decreased. The printed circuit layer may be made of a conductive material such as a conductive paste containing conductive micro-particles or conductive nano-wires (e.g., a silver paste, a silver nano-wire paste, a graphene electric slurry, a carbon nanotube electric slurry, etc.) The printed circuit layer may also be made of a conductive polymer material, for example, poly(3,4-ethylenedioxythiophene): polystyrene sulfonate (PEDOT:PSS), but not limited thereto. In addition to the printed circuit layer, the circuit layer 140 may also be a patterned conductive layer made by a common photolithography and etching method or a common trench plating method for a fine line circuit requirement. The patterned conductive layer may be a metal conductive layer, a transparent conductive layer or a layer made of stacking the two. The metal conductive layer may be a single layer, a stacked layer, a single alloy layer or a stacked alloy layer made of copper, silver, gold, nickel, molybdenum, titanium, aluminum, cobalt, chromium, etc. The material of the transparent conductive layer may be, for example, indium tin oxide (ITO), indium zinc oxide (IZO), aluminum zinc oxide (AZO), etc., but not limited thereto.

Referring to FIG. 3, a designed pattern in FIG. 3 is an example for illustration, and it does not limit the design scope and the practical design requirement. The circuit layer 140 includes at least one or more light-emitting lines 142 and one or more touch-sensing lines 144. One of the light-emitting lines 142 is used to electrically connect to one of the corresponding light-emitting elements 150. At least one portion of the light-emitting elements 150 is disposed on the corresponding portion of the light-emitting lines 142 of the circuit layer 140, and is electrically connected to the corresponding portion of the light-emitting lines 142. Each of the light-emitting elements 150 preferably has a relatively thinner thickness and a relatively smaller volume. The light-emitting element 150 may be, for example, a light-emitting diode (LED), an organic light-emitting diode (OLED) or a laser diode (LD), etc., but not limited thereto. Each of the light-emitting lines 142 is designed to have a disconnected space between two terminals at the place where the corresponding light-emitting element 150 is disposed. A bottom-emitting LED can be used as an example. The center of the bottom-emitting LED has a light-emitting region corresponding to the patterned opening 118 or is adjacent to the patterned opening 118. The bottom-emitting LED has two connecting electrodes on two opposite sides. Using surface mount technology (SMT), the two connecting electrodes at two sides of the bottom-emitting LED are correspondingly mounted and connected to the two terminals of the light-emitting line 142, so that the bottom-emitting LED may be driven by the light-emitting line 142. The associated technology is well known by a person skilled in the art, and will not be described in detail herein.

After each of the light-emitting elements 150 is mounted, each of the light-emitting elements 150 is further sealed by a package sealant 160. In general, the package sealant 160 needs a high transmittance, and the material of the package sealant 160 may be, for example, an optical-grade epoxy resin or an optical-grade silicone. Because the light-emitting element 150 may be easily degraded due to moisture, and the life of the light-emitting element 150 is therefore shortened, by using the package sealant 160, the moisture in the surrounding can be effectively isolated from the light-emitting element 150, and the efficiency and life of the light-emitting element 150 can be increased.

Referring to FIG. 3, a capacitive-type touch sensing structure is demonstrated as an example. Each of the touch-sensing lines 144 of the circuit layer 140 includes at least a touch-connecting line 144a and a touch-sensing pad 144b, and the touch-connecting line 144a is electrically connected to the touch-sensing pad 144b. A plurality of light-out pattern regions 116 are laid out on the transparent substrate 110. Each of the light-out pattern regions 116 may corresponds to a light-emitting element 150 and a touch sensing pad 144b. Both of the light-emitting element 150 and the touch-sensing pad 144b may be disposed within the light-out pattern region 116 or adjacent to the light-out pattern region 116, to obtain both the touch-sensing and the light-emitting functions at the same time for each of the light-out pattern regions 116. In this embodiment, only the example of a touch-connecting line 144a connected to a single touch-sensing pad 144b is demonstrated. In an alternative embodiment of the instant disclosure, each of the touch-connecting lines 144a can also be connected to a plurality of touch-sensing pads 144b in series. A touch-sensing signal is input into the touch-connecting line 144a. When a user's finger or a capacitive stylus pen is close to the touch-sensing pad 144b, a touch position can be detected and determined due to the potential variation of capacitive coupling. If the light-out pattern regions 116 are required to be designed as an array, a plurality of touch-connecting lines 144a can be designed as a staggered mesh arrangement with a plurality of crossed horizontal and vertical touch-connecting lines. A plurality of touch-sensing pads 144b in array may also be correspondingly connected in series to the touch connecting lines 144a respectively arranged in horizontal and vertical to achieve an array touch-sensing function. The detailed pattern design for the above structure is well known by a person skilled in the art, and it will not be described in detail herein.

Referring to FIG. 3, an electronic element 170 is disposed on the circuit layer 140, and is electrically connected to each of the light-emitting lines 142 and each of the touch sensing lines 144. The electronic element 170, which may be a micro-controller unit (MCU), is electrically connected to all of the light-emitting lines 142 and touch sensing lines 144. By sequentially inputting touch sensing signals to the touch sensing lines 144 from the MCU, the potential of each of the touch sensing pads 144b can be sequentially detected and thus the touch position of the user can be determined by potential variance. A light-emitting voltage and a light-emitting current may be applied to the corresponding light-emitting line 142 simultaneously to enable the corresponding light-emitting element 150 to emit light. Therefore, the electronic element 170 can achieve the objective of controlling touch light-emitting function.

Referring to FIGS. 1-3, the touch light-emitting decoration nameplate 100 further includes an electronic connector 180 to electrically connect to an external control circuit. The electronic connector 180 is generally disposed in a peripheral region of the touch light-emitting decoration nameplate 100 to enhance space usage. On the other side of the electronic element 170, a circuit layer 140 is designed with a plurality of external connect lines to dispose the electronic connector 180 on the circuit layer 140, and the electronic connector 180 is electrically connected to the electronic element 170 to transmit a plurality of electrical signals and operation power. The electronic connector 180 may be, for example, a flexible flat cable (FFC) connector or a flexible printed circuit (FPC) connector, etc. These electronic connectors have a smaller volume and design flexibility, but the instant disclosure is not limited thereto.

In a conventional touch nameplate, the overall thickness of the touch nameplate is always over 2 millimeters (mm) since it is made by stacking a transparent nameplate on a printed circuit board. Issues with poor touch sensitivity often occur when the user uses the touch function of the conventional touch nameplate. As shown in FIG. 1, in an embodiment of the instant disclosure, the overall thickness of the touch light-emitting decoration nameplate 100 can be greatly reduced since no printed circuit board is used. The distance D in the vertical direction from the surface of the second decoration ink layer 130 to the circuit layer 140 can be reduced, even to 0.5 mm. Hence touch sensitivity can be greatly improved. Here the thickness of the touch light-emitting decoration nameplate 100 is exemplarily demonstrated, and the thickness is not limited thereto. A thinner thickness for the touch light-emitting decoration nameplate 100 can also be designed to further improve touch sensitivity.

Figure 4A:
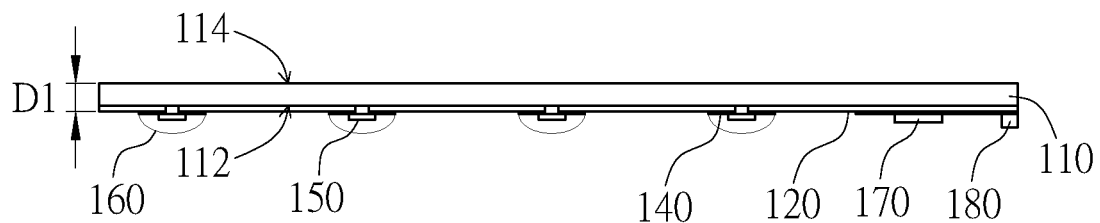
FIG. 4A is a schematic diagram of a cross-sectional view of a touch light-emitting decoration nameplate in another embodiment of the instant disclosure.

FIG. 4A is a schematic diagram of a cross-sectional view of a touch light-emitting decoration nameplate in another embodiment of the instant disclosure. The embodiment is similar to the embodiments previously illustrated in FIGS. 1-3, and the same reference numbers can be correspondingly referred. Referring to FIG. 4A, a touch light-emitting decoration nameplate 100a in the embodiment comprises at least a transparent substrate 110, a first decoration ink layer 120, a circuit layer 140, at least a light-emitting element 150 and an electronic element 170. The transparent substrate 110 includes a first surface 112 and a second surface 114 disposed opposite to each other. In other words, the first surface 112 and the second surface 114 are disposed on opposite sides. Please refer to the description of the embodiments illustrated in FIGS. 1-3 for the material of the transparent substrate 110. In the embodiment, as shown in FIG. 4A, the first decoration ink layer 120 is disposed on only the first surface 112 of the transparent substrate 110; there is no decoration ink layer on the second surface 114 on the other side of the transparent substrate 110. Regarding the first decoration ink layer 120, the circuit layer 140, the light-emitting element 150 and the electronic element 170, please refer to the descriptions of aforesaid embodiments. The advantage of this embodiment is that the second surface 114 of the transparent substrate 110 can be relatively planar since no decoration ink layer is disposed on the second surface 114, so that the durability of the touch light-emitting decoration nameplate 100a can be increased. In addition, since no decoration ink layer is disposed on the second surface 114, the thickness of the touch light-emitting decoration nameplate 100a can be further reduced. The distance D1 in the vertical direction from the second surface 114 to the circuit layer 140 is shortened, and the touch-sensing distance is also relatively shortened. Hence, the sensitivity of the touch-sensing function can be further improved.

Figure 4B:
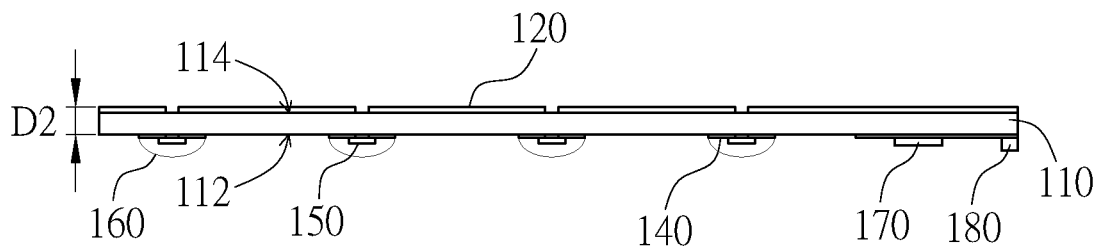
FIG. 4B is a schematic diagram of a cross-sectional view of a touch light-emitting decoration nameplate in another embodiment of the instant disclosure.

FIG. 4B is a schematic diagram of a cross-sectional view of a touch light-emitting decoration nameplate in another embodiment of the instant disclosure. This embodiment is similar to the embodiments previously illustrated in FIGS. 1-3, and the same reference numbers can be correspondingly referred. Referring to FIG. 4B, a touch light-emitting decoration nameplate 100b in the embodiment comprises at least a transparent substrate 110, a first decoration ink layer 120, a circuit layer 140, a light-emitting element 150 and an electronic element 170. Please refer to the description of the embodiments illustrated in FIGS. 1-3 for the material of the transparent substrate 110. In this embodiment, as shown in FIG. 4B, the first decoration ink layer 120 is disposed on only the second surface 114 of the transparent substrate 110; there is no decoration ink layer on the first surface 112 on the other side of the transparent substrate 110. In a modified embodiment, the first decoration ink layer 120 can be replaced by the second decoration ink layer 130. In other words, the second decoration ink layer 130 can be disposed on the second surface 114 of the transparent substrate 110 (not shown). In this embodiment, since the first decoration ink layer 120 is only disposed on the second surface of the transparent substrate 110, and no decoration ink layer is disposed on the first surface 112 of the transparent substrate 110, the circuit layer 140 is then disposed on the first surface 112 of the transparent substrate 110. And since the first decoration ink layer 120 is disposed on the second surface 114 of the transparent substrate 110, the first decoration ink layer 120 may use a highly durable ink to prevent the problems of the first decoration ink layer 120 peeling off and casting off due to long-term touch. Furthermore, since no decoration ink layer is disposed on the first surface 112, the thickness of the touch light-emitting decoration nameplate 100b can be further reduced. The distance D2 in the vertical direction from the surface of the first decoration ink layer 120 to the circuit layer 140 is shortened, and the touch-sensing distance is relatively further shortened. Hence, the sensitivity of the touch-sensing function can be further improved. In addition, since the transparent substrate 110 is located between the first decoration ink layer 120 and the light-emitting element 150 in this embodiment, and the transparent substrate 110 has the effect of partial light guiding and light dispersion, the patterned opening 118 in the light-out pattern region 116 can have higher light uniformity and display a more uniform pattern.

Figure 5A:
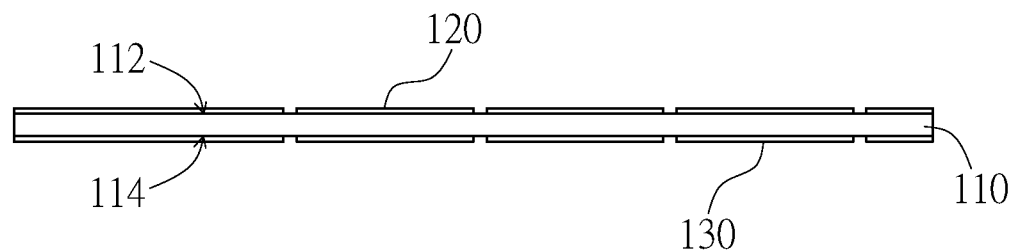
FIGS. 5A-5D are schematic diagrams of a fabrication process of a touch light-emitting decoration nameplate in an embodiment of the instant disclosure.

FIGS. 5A-5D are schematic diagrams of the fabrication process of a touch light-emitting decoration nameplate in an embodiment of the instant disclosure. Referring to FIG. 5A, a fabrication method of a touch light-emitting decoration nameplate 100 in the embodiment is demonstrated. First, a transparent substrate 110 is provided. The transparent substrate 110 has a first surface 112 and a second surface 114 disposed opposite to each other. In other words, the first surface 112 and the second surface 114 are disposed on opposite sides of the transparent substrate 110. Please refer to the description of the embodiments illustrated in FIGS. 1-3 for the material of the transparent substrate 110.

As shown in FIG. 5A, a first decoration ink layer 120 is then formed on the first surface 112 of the transparent substrate 110. Moreover, a second decoration ink layer 130 is formed on the second surface 114 on the other side of the transparent substrate 110. The locations of the first decoration ink layer 120 and the second decoration ink layer 130 may also be exchanged. That is, the first decoration ink layer 120 may be formed on the second surface 114, and the second decoration ink layer 130 may be formed on the first surface 112. In a modified embodiment, as shown in FIG. 4A, the first decoration ink layer 120 may be formed on only the first surface 112 of the transparent substrate 110, and no decoration ink layer is formed on the second surface 114 of the transparent substrate 110. Alternatively, as shown in FIG. 4B, the first decoration ink layer 120 may be formed on only the second surface 114 of the transparent substrate 110, and no decoration ink layer is formed on the first surface 112 of the transparent substrate 110. In another modified embodiment, the first decoration ink layer 120 may be replaced by the second decoration ink layer 130; i.e., the second decoration ink layer 130 may be formed on only the second surface 114 of the transparent substrate 110 (not shown).

The first decoration ink layer 120 and the second decoration ink layer 130 may be a colored dielectric layer made of ink having high light-shielding capability. The first decoration ink layer 120 and the second decoration ink layer 130 can be designed to have one or more light-out pattern regions 116 corresponding to one or more subsequently disposed light-emitting element 150. Each of the light-out pattern regions 116 can be designed to have a corresponding patterned opening 118 without ink therein, or with ink having a light color or a thin thickness to obtain the result of high light transmission, semi-light transmission or low light transmission. The patterned opening 118 of the light-out pattern region 116 can be designed to have, e.g., a functional pattern or a decorative pattern. For example, a pattern shape of the patterned opening 118 in the light-out pattern region 116 may be a number symbol, a letter symbol, an arrow symbol, a power symbol, a sound volume symbol, etc., and may be decided according to the usage requirement. The first decoration ink layer 120 and the second decoration ink layer 130 can be formed on the transparent substrate 110 by an ink-jet printing process or a screen printing process. The first decoration ink layer 120 and the second decoration ink layer 130 can be made of a single ink layer or multiple ink layers of the same color or different colors. The thickness of the first decoration ink layer 120 and the second decoration ink layer 130 can be adjusted according to the ink color requirement, the ink light-shielding effect, the light transmission effect in the light-out region and the touch sensitivity, depending on the usage requirement.

In an alternative embodiment, as shown in FIG. 4A, the first decoration ink layer 120 may be disposed on only the first surface 112 of the transparent substrate 110; there is no decoration ink layer disposed on the second surface 114 on the other side of the transparent substrate 110. Moreover, as shown in FIG. 4B, the first decoration ink layer 120 may be disposed on only the second surface 114 of the transparent substrate 110; there is no decoration ink layer on the first surface 112 on the other side of the transparent substrate 110.

Figure 5B:
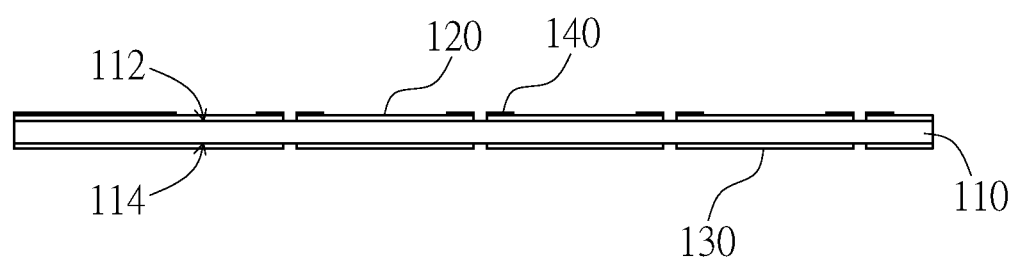

Referring to FIG. 5B, the circuit layer 140 is formed on the first decoration ink layer 120. The circuit layer 140 includes at least a light-emitting line 142 and a touch-sensing line 144. The circuit layer 140 may be formed on the first decoration ink layer 120. In a modified embodiment, when the first decoration ink layer 120 is formed on the second surface 114 of the transparent substrate 110, the circuit layer 140 may also be formed on the first surface 112 of the transparent substrate 110. The circuit layer 140 may be a printed circuit layer made of a patterned circuit formed on the first decoration ink layer 120 by an ink-jet printing process or a screen printing process. The printed circuit layer can be directly formed on the first decoration ink layer 120 after a low temperature curing process, and the overall thickness of the final product can be relatively decreased. In addition to the printed circuit layer, the circuit layer 140 may also be a patterned conductive layer made by a common photolithography and etching method or a common trench plating method for fine line circuit requirement. Regarding the material of the circuit layer 140, please refer to the description of the embodiments illustrated in FIGS. 1-3, and it will not be described in detail herein.

The circuit layer 140 includes at least one or more light-emitting lines 142 and one or more touch sensing lines 144. A capacitive-type touch-sensing structure is demonstrated as an example. Each of the touch sensing lines 144 of the circuit layer 140 includes at least a touch-connecting line 144a and a touch-sensing pad 144b, and the touch-connecting line 144a is electrically connected to the touch-sensing pad 144b. For the design of the circuit layer 140, please refer to the description of the embodiments illustrated in FIGS. 1-3, and it will not be described in detail herein.

Furthermore, a buffer layer (not shown) may be optionally formed between the circuit layer 140 and the transparent substrate 110 to improve the adhesion and reliability between the circuit layer 140 and the transparent substrate 110. Corresponding to the embodiments illustrated in FIGS. 1-3, the buffer layer may be formed between the circuit layer 140 and the first decoration ink layer 120. Or, the first decoration ink layer 120 and the second decoration ink layer 130 may be exchanged, and the buffer layer may be formed between the circuit layer 140 and the second decoration ink layer 130. Corresponding to the embodiment illustrated in FIG. 4A, the buffer layer may be formed between the circuit layer 140 and the first decoration ink layer 120. Corresponding to the embodiment illustrated in FIG. 4B, the buffer layer may be formed between the circuit layer 140 and the first surface 112 of the transparent substrate 110. The buffer layer is preferably having a thinner thickness, such as a thickness smaller than 100 micrometer (μm), to prevent reducing touch sensitivity due to too thick of a thickness. The buffer layer may be made of an inorganic material, an organic material or a combination formed by stacking the two. The inorganic material may be, for example, silicon oxide (SiOx), silicon nitride (SiNx), silicon oxynitride (SiOxNy), aluminum oxide (AlOx), aluminum oxynitride (AlOxNy), or other similar material. The organic material may be, for example, an amine-series polymer such as polyamide (PA), polyimide (PI), an acrylate-series polymer such as polymethylmethacrylate (PMMA) or an ether-series polymer such as polyethersulfone (PES), polyetheretherketone (PEEK), etc., but not limited thereto.

A patterned dielectric layer (not shown) may be optionally formed between the lines of the circuit layer 140 to improve adhesion stability and simultaneously reduce electrical interference between different lines with respective functions. The thickness of the patterned dielectric layer may be thinner than or substantially equal to the thickness of the circuit layer 140 to improve the flatness of the circuit layer 140. The patterned dielectric layer may be fabricated by lithography technology after finishing the circuit layer 140. Alternatively, the patterned dielectric layer may be formed on the first decoration ink layer 120 first, and then the circuit layer 140 is formed in the gap of the patterned dielectric layer. The patterned dielectric may be made of an inorganic material, an organic material, or a combination formed by stacking the two. For the material of the patterned dielectric layer, please refer to the aforesaid material of the buffer layer, and it will not be described in detail herein.

After the fabrication process of the circuit layer 140 is finished, a patterned passivation layer (not shown) may be optionally formed on the circuit layer 140 covering most portions of the circuit layer 140 to protect the circuit layer 140. The thickness of the patterned passivation layer may be, for example, thicker than the thickness of the circuit layer 140 to enhance the protection effect to the circuit layer 140. The patterned passivation layer may be, for example, fabricated by the lithography technology to make the patterned passivation layer with a prearranged pattern for conveniently subsequent mounting process. The patterned passivation layer may be made of an inorganic material, an organic material or a combination formed by stacking the two. For the material of the patterned passivation layer, please refer to the material of the buffer layer, and it will not be described in detail herein.

Figure 5C:
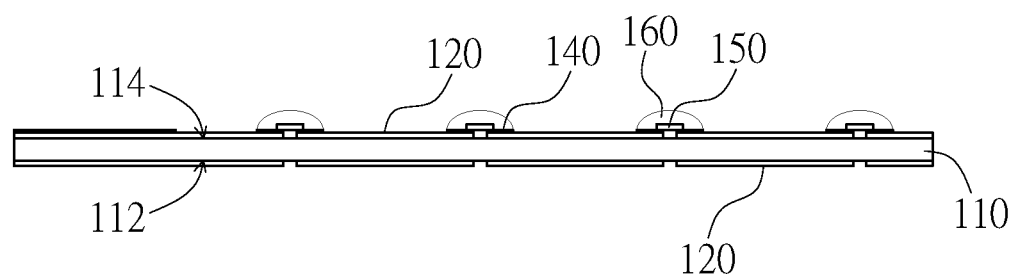

Referring to FIG. 5C, each of the light-emitting elements 150 is mounted on at least a portion of the corresponding light-emitting line 142 of the circuit layer 140, and electrically connected to the light-emitting line 142. Each of the light-emitting elements 150 is preferably thin in thickness and small in volume. The light-emitting element 150 may be, for example, a light-emitting diode (LED), an organic light-emitting diode (OLED), a laser diode (LD), etc., but not limited thereto. Take LED as an example. A LED has two connecting electrodes on two sides. Using surface mount technology (SMT), the two connecting electrodes at two sides of the bottom-emitting LED are correspondingly mounted and connected to the two terminals of the light-emitting line 142, so that the bottom-emitting LED may be driven by the light-emitting line 142. The associated technology is well known by a person skilled in the art, and will not be described in detail herein.

After each of the light-emitting elements 150 is mounted, a package sealant 160 is further formed to cover and seal each of the light-emitting elements 150. The package sealant 160 can be preparatively covering the light-emitting element 150 by utilizing a dispenser. The package sealant 160 is then completely cured to meet the sealing requirement by utilizing light curing or thermal curing. The package sealant 160 needs a high transmittance. The material of the package sealant 160 may be, for example, an optical-grade epoxy resin or an optical-grade silicone. For the related detailed description corresponding to the light-emitting element 150 and the package sealant 160, please refer to the embodiments illustrated in FIGS. 1-3, and it will not be described in detail herein.

Figure 5D:
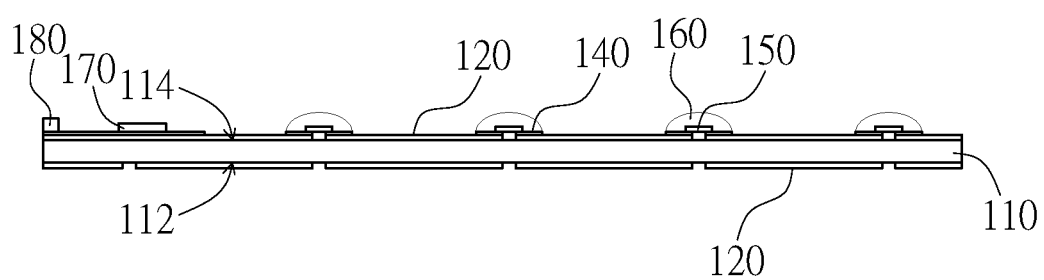

Referring to FIG. 5D, the electronic element 170 is disposed on the circuit layer 140 and is electrically connected to each of the light-emitting lines 142 and each of the touch-sensing lines 144. The electronic element 170 may be, for example, a micro-controller unit (MCU) electrically connected to each of the light-emitting lines 142 and each of the touch-sensing lines 144. Besides, on the external side of the electronic element 170, the electronic connector 180 is disposed on the circuit layer 140 and electrically connected to the electronic element 170 to transmit a plurality of electrical signals and operation power. The electronic element 170 and the electronic connector 180 can be mounted by utilizing, for example, surface mount technology (SMT). A mounting glue or a solder paste is printed on the corresponding portions of the circuit layer 140, and the electronic element 170 and the electronic connector 180 are then mounted on the corresponding locations by a mounter. Subsequently, the electronic element 170 and the electronic connector 180 are respectively electrically connected to the corresponding lines of the circuit layer 140. If a dense circuit design is used for the electronic element 170, the ball grid array (BGA) technology may be used to mount and electrically connect the electronic element 170 to the corresponding lines of the circuit layer 140.

In the embodiment of the instant disclosure, since the first decoration ink layer 120 and the second decoration ink layer 130 are formed on the transparent substrate 110, alignment marks can be simultaneously fabricated at the edge of the transparent substrate 110. Therefore, when the circuit layer 140 is fabricated, the alignment marks in the first decoration ink layer 120 or the second decoration ink layer 130 can be read. As such, the circuit layer 140 can be precisely aligned to the first decoration ink layer 120 and the second decoration ink layer 130, and thus size and alignment tolerances can be greatly reduced to minimize the touch sensing shift problem.

Embodiments of the instant disclosure are directed to a touch light-emitting decoration nameplate and a fabrication method thereof. A first decoration ink layer is disposed on the transparent substrate. A circuit layer is disposed on the decoration ink layer or the transparent substrate. The thickness from the surface of the first decoration ink layer to the circuit layer can be greatly reduced. Since the touch-sensing line in the circuit layer used to sense the touch potential of the user is separated from the user by only the decoration ink layer and the transparent substrate, the touch-sensing distance is relatively reduced, and the touch sensitivity is thus greatly improved. Furthermore, the circuit layer may be fabricated while aligned with the alignment marks in the decoration ink layer, the size and alignment tolerances between the circuit layer and the decoration ink layer can be reduced, and the touch sensing shift problem can be minimized.

Although the preferred embodiments of the instant disclosure have been described herein, the above description is merely illustrative. The preferred embodiments disclosed will not limit the scope of the instant disclosure. Further modification of the instant disclosure herein disclosed will occur to those skilled in the respective arts and all such modifications are deemed to be within the scope of the instant disclosure as defined by the appended claims.

What is claimed is:

1. A touch light-emitting decoration nameplate, comprising:
a transparent substrate, including a first surface and a second surface in opposite;
a first decoration ink layer, disposed on one of the first surface or the second surface of the transparent substrate;
a circuit layer, disposed on one of the first decoration ink layer or the first surface of the transparent substrate, and the circuit layer at least including a light-emitting line and a touch sensing line;
a light-emitting element, disposed on the light-emitting line of the circuit layer, and electrically connected to the light-emitting line; and
an electronic element, disposed on the circuit layer, and electrically connected to the light-emitting line and the touch sensing line,
wherein the circuit layer is disposed between the transparent substrate and the light-emitting element on the first surface of the transparent substrate opposite to a touch surface.

2. The touch light-emitting decoration nameplate of claim 1, wherein the first decoration ink layer is disposed on the first surface of the transparent substrate, and the circuit layer is disposed on the first decoration ink layer.

3. The touch light-emitting decoration nameplate of claim 1, wherein the first decoration ink layer is disposed on the second surface of the transparent substrate, and the circuit layer is disposed on the first surface of the transparent substrate.

4. The touch light-emitting decoration nameplate of claim 1, further comprises a second decoration ink layer, disposed in opposite to the first decoration ink layer, and disposed on one of the first surface or the second surface of the transparent substrate.

5. The touch light-emitting decoration nameplate of claim 1, wherein the transparent substrate includes a transparent plastic substrate, a transparent glass substrate or a transparent ceramic substrate.

6. The touch light-emitting decoration nameplate of claim 1, wherein the first decoration ink layer includes a colored dielectric layer.

7. The touch light-emitting decoration nameplate of claim 1, wherein the circuit layer includes a printed circuit layer.

8. The touch light-emitting decoration nameplate of claim 1, wherein the touch sensing line includes a touch connecting line and a touch sensing pad, and the touch connecting line is electrically connected to the touch sensing pad.

9. The touch light-emitting decoration nameplate of claim 1, wherein the light-emitting element includes a light-emitting diode.

10. The touch light-emitting decoration nameplate of claim 1, further comprises a package sealant covering the light-emitting element.

11. The touch light-emitting decoration nameplate of claim 1, wherein the electronic element includes a microcontroller unit (MCU).

12. The touch light-emitting decoration nameplate of claim 1, further comprises an electronic connector disposed on the circuit layer, and the electronic connector is electrically connected to the electronic element.

13. A fabrication method of a touch light-emitting decoration nameplate, comprising:
providing a transparent substrate including a first surface and a second surface in opposite;
forming a first decoration ink layer on one of the first surface or the second surface of the transparent substrate;
forming a circuit layer on one of the first decoration ink layer or the first surface of the transparent substrate, and the circuit layer at least including a light-emitting line and a touch sensing line;
disposing a light-emitting element on the light-emitting line of the circuit layer, and the light-emitting element being electrically connected to the light-emitting line; and
disposing an electronic element on the circuit layer, and the electronic element being electrically connected to the light-emitting line and the touch sensing line,
wherein the circuit layer is disposed between the transparent substrate and the light-emitting element on the first surface of the transparent substrate opposite to a touch surface.

14. The fabrication method of claim 13, wherein the first decoration ink layer is formed on the first surface of the transparent substrate, and the circuit layer is formed on the first decoration ink layer.

15. The fabrication method of claim 13, wherein the first decoration ink layer is formed on the second surface of the transparent substrate, and the circuit layer is formed on the first surface of the transparent substrate.

16. The fabrication method of claim 13, further comprises forming a second decoration ink layer located in opposite to the first decoration ink layer, and the second decoration ink layer being formed on one of the first surface or the second surface of the transparent substrate.

17. The fabrication method of claim 13, wherein the transparent substrate includes a transparent plastic substrate, a transparent glass substrate or a transparent ceramic substrate.

18. The fabrication method of claim 13, wherein the touch sensing line includes a touch connecting line and a touch sensing pad, and the touch connecting line is electrically connected to the touch sensing pad.

19. The fabrication method of claim 13, further comprises forming a package sealant to cover the light-emitting element.

20. The fabrication method of claim 13, further comprises disposing an electronic connector on the circuit layer, and the electronic connector being electrically connected to the electronic element.

* * * * *